(12) United States Patent
Hoffmann et al.

(10) Patent No.: US 10,691,154 B1
(45) Date of Patent: *Jun. 23, 2020

(54) PROCESS TO REDUCE THE PROBABILITY OF LARGE CASCADING FAILURES IN A TRANSMISSION NETWORK

(71) Applicant: HRL Laboratories, LLC, Malibu, CA (US)

(72) Inventors: Heiko Hoffmann, Simi Valley, CA (US); Tsai-Ching Lu, Thousand Oaks, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 149 days.

This patent is subject to a terminal disclaimer.

(21) Appl. No.: 15/496,791

(22) Filed: Apr. 25, 2017

Related U.S. Application Data

(63) Continuation-in-part of application No. 14/747,217, filed on Jun. 23, 2015, now Pat. No. 10,139,844.

(60) Provisional application No. 62/016,443, filed on Jun. 24, 2014.

(51) Int. Cl.
| | |
|---|---|
| G05D 3/12 | (2006.01) |
| G05D 5/00 | (2006.01) |
| G05D 9/00 | (2006.01) |
| G05D 11/00 | (2006.01) |
| G05D 17/00 | (2006.01) |
| G05F 1/66 | (2006.01) |
| G05B 15/02 | (2006.01) |
| G06Q 50/06 | (2012.01) |
| G01R 31/08 | (2020.01) |

(52) U.S. Cl.
CPC .............. *G05F 1/66* (2013.01); *G01R 31/086* (2013.01); *G05B 15/02* (2013.01); *G06Q 50/06* (2013.01)

(58) Field of Classification Search
CPC ............ G05F 1/66; G05B 15/02; G06Q 50/06
USPC ................................................... 700/292
See application file for complete search history.

(56) References Cited

U.S. PATENT DOCUMENTS

| | | | |
|---|---|---|---|
| 8,589,198 B2 | 11/2013 | McMullin | |
| 2007/0067065 A1* | 3/2007 | El-Gasseir | G06Q 10/00 700/286 |
| 2011/0282508 A1* | 11/2011 | Goutard | H02J 3/06 700/293 |
| 2011/0313581 A1* | 12/2011 | Genc | G05B 23/0248 700/292 |
| 2012/0123602 A1* | 5/2012 | Sun | H02J 3/14 700/292 |

(Continued)

OTHER PUBLICATIONS

Robert W. Smeaton (ed) Switchgear and Control Handbook 3rd Ed., McGraw Hill, New York (1997), Chapter 10, pp. 10.3-10.16.

(Continued)

*Primary Examiner* — Md Azad
(74) *Attorney, Agent, or Firm* — Tope-McKay & Associates

(57) ABSTRACT

Described is a system for decreasing the frequency of large cascading failures in a transmission network. Based on sensors distributed throughout the transmission network, the system determines if a cascading failure is present in a transmission network. Following determination of the cascading failure, the system activates at least one switch of a plurality of switches distributed in the transmission network in order to switch transmission lines, thereby altering connectivity in the transmission network.

19 Claims, 7 Drawing Sheets

(56) References Cited

U.S. PATENT DOCUMENTS

| | | | |
|---|---|---|---|
| 2012/0180663 A1 | 7/2012 | Easton et al. | |
| 2014/0012954 A1* | 1/2014 | Dorn | G01D 4/002 709/219 |
| 2014/0180663 A1* | 6/2014 | Acharya | H02J 13/001 703/18 |

OTHER PUBLICATIONS

P. L. Anderson and I. K. Geckil, Anderson Economic Group Working Paper 2 (2003), pp. 1-8.

P.-A. Noel, C. D. Brummitt, and R. M. D'Souza, Physical Review Letters 111, 078701 (2013), pp. 078701-1-078701-5.

T. A. Davis, "Algorithm 832: UMFPACK V4.3—an Unsymmetric-Pattern Multifrontal Method," ACM Trans. Math. Softw. 30, pp. 196-199, 2004.

B. A. Carreras, V. E. Lynch, I. Dobson, and D. E. Newman, in Hawaii International Conference on System Sciences (IEEE, 2002), 0-7695-1435-9/02.

H. J. Jensen, Self-Organized Criticality: Emergent Complex Behavior in Physical and Biological Systems, Cambridge Lecture Notes in Physics (Cambridge University Press, 1998), Section 2.1, p. 7-8, and Section 4.2.2, pp. 34-35.

R. D. Zimmerman, C. E. Murillo-Sanchez, and R. J. Thomas, "MATPOWER: Steady-State Operations, Planning and Analysis Tools for Power Systems Research and Education," Power Systems, IEEE Transactions on, vol. 26, No. 1, pp. 12-19, (2011).

S.-J. S. Tsai, L. Zhang, A. G. Phadke, Y. Liu, M. R. Ingram, S. C. Bell, I. S. Grant, D. T. Bradshaw, D. Lubkeman, L. Tang, Study of global frequency dynamic behavior of large power systems, in: Power Systems Conference and Exposition, vol. 1, IEEE, pp. 328-335, (2004).

Office Action 1 for U.S. Appl. No. 14/747,217, dated Jun. 7, 2017.
Response to Office Action 1 for U.S. Appl. No. 14/747,217, dated Sep. 7, 2017.
Office Action 2 for U.S. Appl. No. 14/747,217, dated Oct. 12, 2017.
Response to Office Action 2 for U.S. Appl. No. 14/747,217, dated Dec. 8, 2017.
Office Action 3 for U.S. Appl. No. 14/747,217, dated Jan. 25, 2018.
Response to Office Action 3 for U.S. Appl. No. 14/747,217, dated Apr. 24, 2018.
Notice of Allowance for U.S. Appl. No. 14/747,217, dated Jul. 31, 2018.

* cited by examiner

PROCESS TO REDUCE THE PROBABILITY OF LARGE CASCADING FAILURES IN A TRANSMISSION NETWORK

CROSS-REFERENCE TO RELATED APPLICATIONS

This is a Continuation-in-Part application of U.S. application Ser. No. 14/747,217, filed in the United States on Jun. 23, 2015, entitled, "Method to Suppress Cascading Failures in a Transmission Network," which is a Non-Provisional Application of U.S. Provisional Patent Application No. 62/016,443, filed Jun. 24, 2014, entitled, "Method to Suppress Cascading Failures in a Transmission Network", the entirety of which are incorporated herein by reference.

GOVERNMENT LICENSE RIGHTS

This invention was made with government support under U.S. Government Contract Number N66001-15-C-4020. The government has certain rights in the invention.

BACKGROUND OF INVENTION

(1) Field of Invention

The present invention relates to a system for reducing large cascading network failures and, more particularly, to a system for reducing large cascading network failures through installation of switches that switch lines after each cascading failure.

(2) Description of Related Art

A cascading failure is a failure in a system of interconnected parts, such as a power transmission network, in which the failure of a part can trigger the failure of successive parts. Cascading failure is common in power grids when one of the elements fails (completely or partially) and shifts its load to nearby elements in the system. Those nearby elements are then pushed beyond their capacity so they become overloaded and shift their load onto other elements.

For the power-grid, the cost of an outage depends non-linearly on its size: smaller outages can be compensated by backup systems, while large events lead to lost revenue, spoiled goods, and other cost in addition to repairs. For instance, the 2003 Northeast Blackout was estimated to reduce U.S. earning by $6.4 billion (see the List of Incorporated Literature References, Literature Reference No. 1).

McMullen devised a method for operating a power grid (see Literature Reference No. 3). This method keeps track of damaged asset data and generates a plan to restore the power grid, but does not alter the power grid in a way that the emergent distribution of cascading failures changes, reducing the likelihood of large cascading failures. Further, the smart-grid concept envisions smart switches to automatically reroute power around problem areas. While this strategy may reduce the severity of a particular cascade (e.g., by mitigating small-size cascading failures with localized routing heuristics), it does not take into account the self-organization in the grid that eventually leads to very large failures.

Thus, a continuing need exists for a solution to reduce the likelihood of large cascading failures in a network (e.g., the power grid).

SUMMARY OF INVENTION

The present invention relates to a system for reducing large cascading network failures and, more particularly, to a system for reducing large cascading network failures through installation of switches that switch lines after each cascading failure. The system comprises one or more processors and a non-transitory computer-readable medium having executable instructions encoded thereon such that when executed, the one or more processors perform multiple operations. The system determines if a cascading failure is present in a transmission network having transmission lines. Following determination of the cascading failure, the system activates at least one switch of a plurality of switches distributed in the transmission network in order to switch transmission lines, thereby altering connectivity in the transmission network.

In another aspect, a plurality of sensors distributed throughout the transmission network monitor occurrence of cascading failures by identifying tripped or broken transmission lines.

In another aspect, the system activates a subset of the plurality of switches following determination of the cascading failure.

In another aspect, the system gradually activates each of the plurality of switches individually following determination of the cascading failure.

In another aspect, the system gradually activates subsets of the plurality of switches, each subset at a time, following determination of the cascading failure.

In another aspect, the transmission network is a smart grid used by electrical vehicles.

In another aspect, altering connectivity in the transmission network prevents the accumulation of a large cluster of transmission lines that are vulnerable to a cascading failure.

In another aspect, non-cascading failures in the transmission network become more frequent when connectivity in the transmission network is altered.

In another aspect, the transmission network comprises at least one set of a plurality of buses, wherein the plurality of buses in the set are connected in series by transmission lines and consecutively numbered, such that a first bus is not directly connected with a last bus, wherein for each set, a switch is installed at one of the first or the last bus in the set and a transmission line is installed connecting the switch and the other of the first or the last bus, such that a switch setting can alternate between two connectivity configurations.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
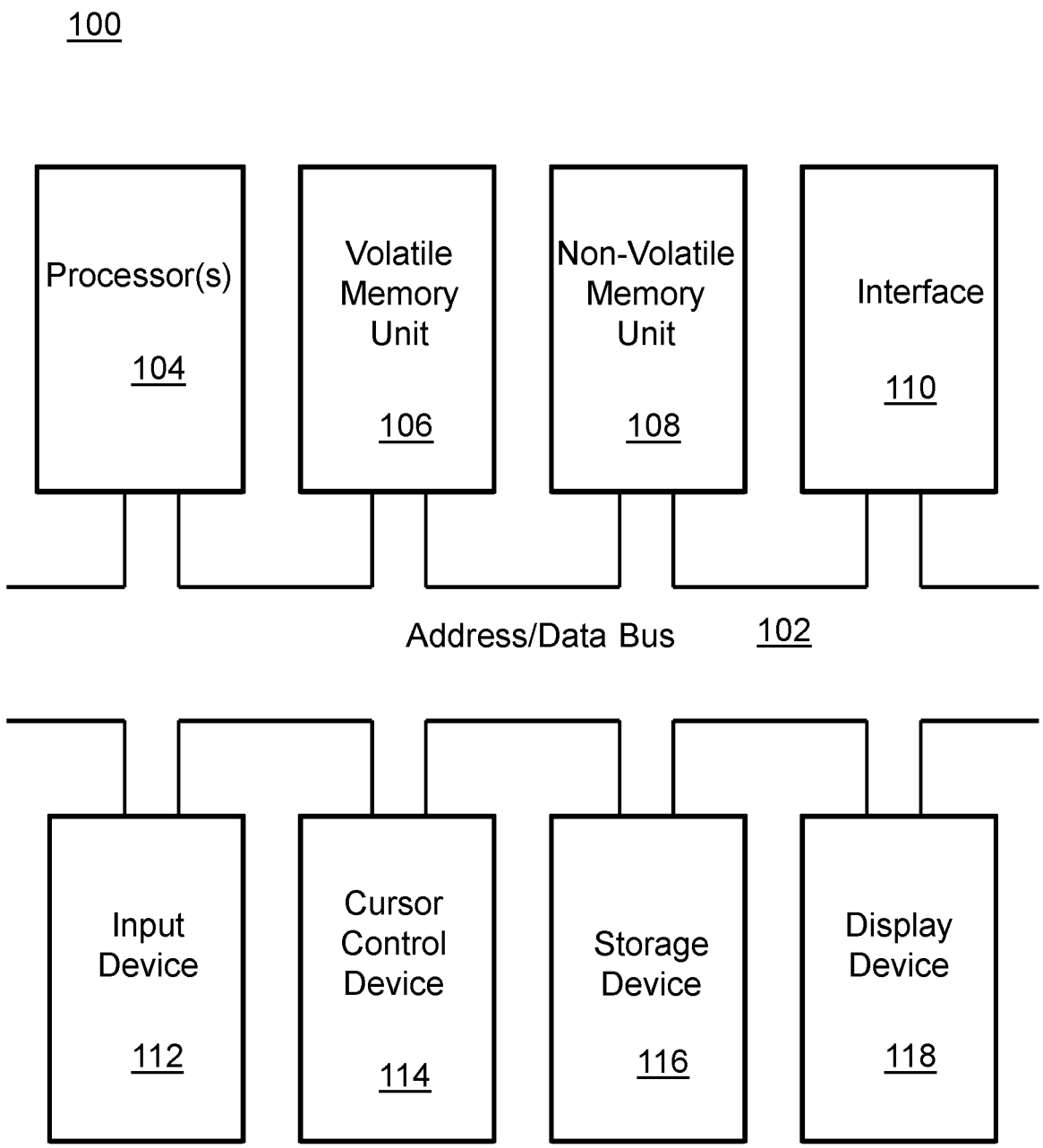
FIG. 1 is a block diagram depicting the components of a system for reducing large cascading network failures according to some embodiments of the present disclosure.

The present invention relates to a system for reducing large cascading network failures and, more particularly, to a system for reducing large cascading network failures through installation of switches that switch lines after each cascading failure.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a list of cited references is provided. Next, a description of the various principal aspects of the present invention is provided. Finally, specific details of various embodiment of the present invention are provided to give an understanding of the specific aspects.

(1) LIST OF INCORPORATED LITERATURE AND PATENT REFERENCES

The following references are cited and incorporated throughout this application. For clarity and convenience, the references are listed herein as a central resource for the reader. The following references are hereby incorporated by reference as though fully set forth herein. The references are cited in the application by referring to the corresponding literature reference number.

1. P. L. Anderson and I. K. Geckil, Anderson Economic Group Working Paper 2 (2003).
2. P.-A. Noel, C. D. Brummitt, and R. M. D'Souza, Physical Review Letters 111, 078701 (2013).
3. U.S. Pat. No. 8,589,198. Dale R. McMullen, Methods and systems involving power system grid management (2013).
4. Robert W. Smeaton (ed) Switchgear and Control Handbook 3rd Ed., McGraw Hill, New York (1997), Chapter 10, pages 10.3-10.16.
5. R. D. Zimmerman, C. E. Murillo-Sánchez, and R. J. Thomas, "MATPOWER: Steady-State Operations, Planning and Analysis Tools for Power Systems Research and Education," Power Systems, IEEE Transactions on, vol. 26, no. 1, pp. 12-19, (2011).
6. S.-J. S. Tsai, L. Zhang, A. G. Phadke, Y. Liu, M. R. Ingram, S. C. Bell, I. S. Grant, D. T. Bradshaw, D. Lubkeman, L. Tang, Study of global frequency dynamic behavior of large power systems, in: Power Systems Conference and Exposition, Vol. 1, IEEE, pp. 328-335, (2004).

(2) PRINCIPAL ASPECTS

Various embodiments of the invention include three "principal" aspects. The first is a system for reducing large cascading network failures. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
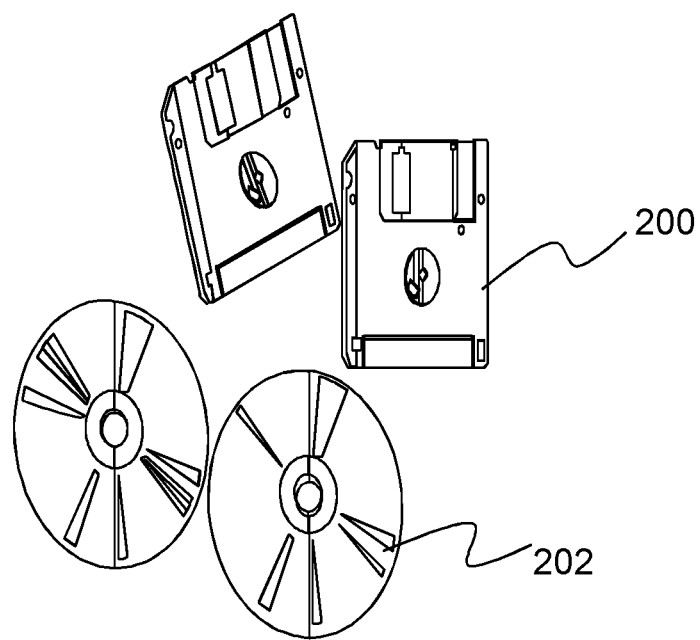
FIG. 2 is an illustration of a computer program product according to some embodiments of the present disclosure.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(3) SPECIFIC DETAILS OF VARIOUS EMBODIMENTS

Described is a solution to reduce the likelihood of large cascading failures in a transmission network (e.g., the power grid), which suppresses such failures by installing switches that switch transmission lines after each cascading failure. It is not obvious that switching between transmission lines after a cascading failure should reduce the probability of large-scale failure. On the contrary, intuitively, it should have no impact on the failure distribution. Moreover, the interacting power-grid components cannot be modeled mathematically in closed form.

Figure 3:
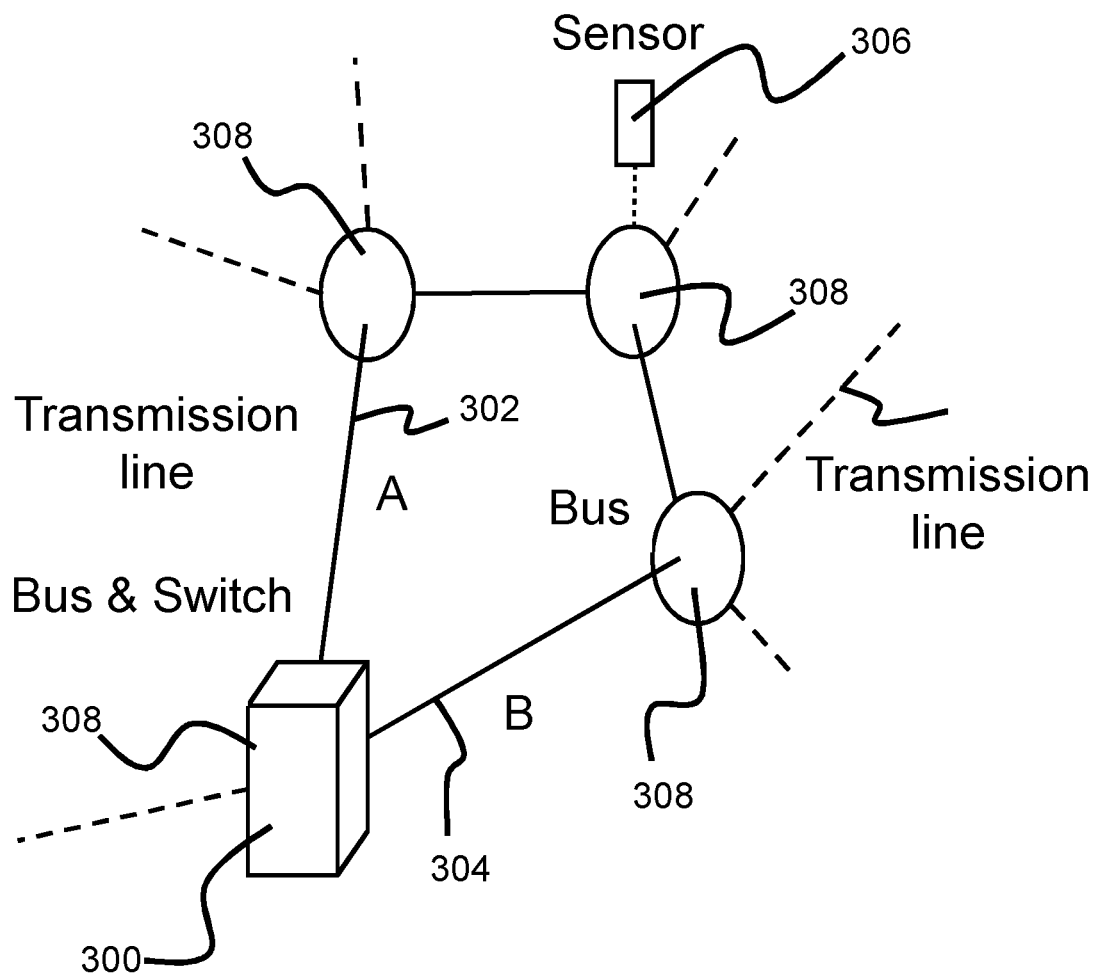
FIG. 3 is an illustration of elements of a system for reducing large cascading network failures according to some embodiments of the present disclosure.

FIG. 3 illustrates an example of elements of the system according to embodiments of the present disclosure. Throughout the network, several switches are installed. In the embodiment depicted in FIG. 3, a switch 300 connects either transmission line A (element 302) or B (element 304). The arrangement of solid lines marks the basic sub-graph at each switch. Sensors 306 throughout the network monitor the occurrence of cascading failures. A non-limiting example of a sensor is a voltage meter. A sudden voltage drop to near zero volt within a few seconds (e.g., within 3, 10, 30, or 60 seconds) across an area of sensors indicates a cascading failure, where the area of sensors includes at least two separately located substations of a transmission network. Alternate areas may include 3, 5, or 10 substations. When the sensors 306 detect that a cascading failure occurred, all switches 300 change connectivity from A (element 302) to B (element 304), or vice versa. A goal for various embodiments is to decouple the network changes (through the switches 300) from the cascading failures.

In one embodiment, to upgrade an existing power grid according to the principles of the invention, first, N sets of four buses are identified. For the choice of these sets, there are two constraints: 1) in each set, the four buses are connected in series by transmission lines (the buses may have additional connections); and 2) the first and last bus are not directly connected with each other through a transmission line. Under these constraints, in a desired embodiment, the N sets are chosen at random from the buses in the transmission network.

Figure 7A:
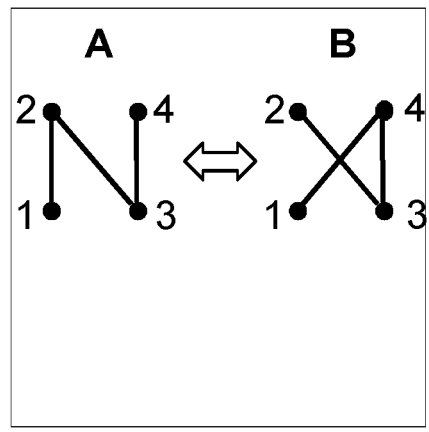
FIG. 7A is an illustration of switching between two alternative local connections according to some embodiments of the present disclosure.

For each set, a switch is installed at the first or last bus in the series. Let the sequence of buses in a set be consecutively numbered from 1 to 4, and define bus 1 to be the one with the switch. Next, a transmission line has to be installed connecting the switch and bus 4. Therefore, the switch is set up to either connect buses 1 and 2 or buses 1 and 4, as depicted in FIG. 7A. Thus, changing the switch setting alternates between two connectivity configurations. This arrangement of lines and switches was chosen because it maintains the path-connectedness of the grid network independent of the switch settings. Path-connectedness is important to maintain power flow between all buses.

A non-limiting example for a switch 300 is a mechanical link that can flip between two possible electrical connections. Another embodiment could be a switchgear (see Literature Reference No. 4) connected to each alternative line (A (element 302) or B (element 304) FIG. 3) at the location of the switch bus 308. The two switchgears are synchronized such that one of them always connects a line to the bus 308. In both cases, the switches or switchgears (element 300) are connected to a central computer, which triggers each switch 300 after a cascading failure was detected. In one embodiment, all switches change their settings after a cascading failure. Alternatively, a random subset of switches changes their settings. Preferably, for grid stability, the switches are turned (i.e., activated) before regular start-up procedures if they are part of a blackout area, or turned on gradually if not. In the latter case, the gradual activation should be consistent with rules for regular startup procedures to avoid voltage surges.

Figure 4:
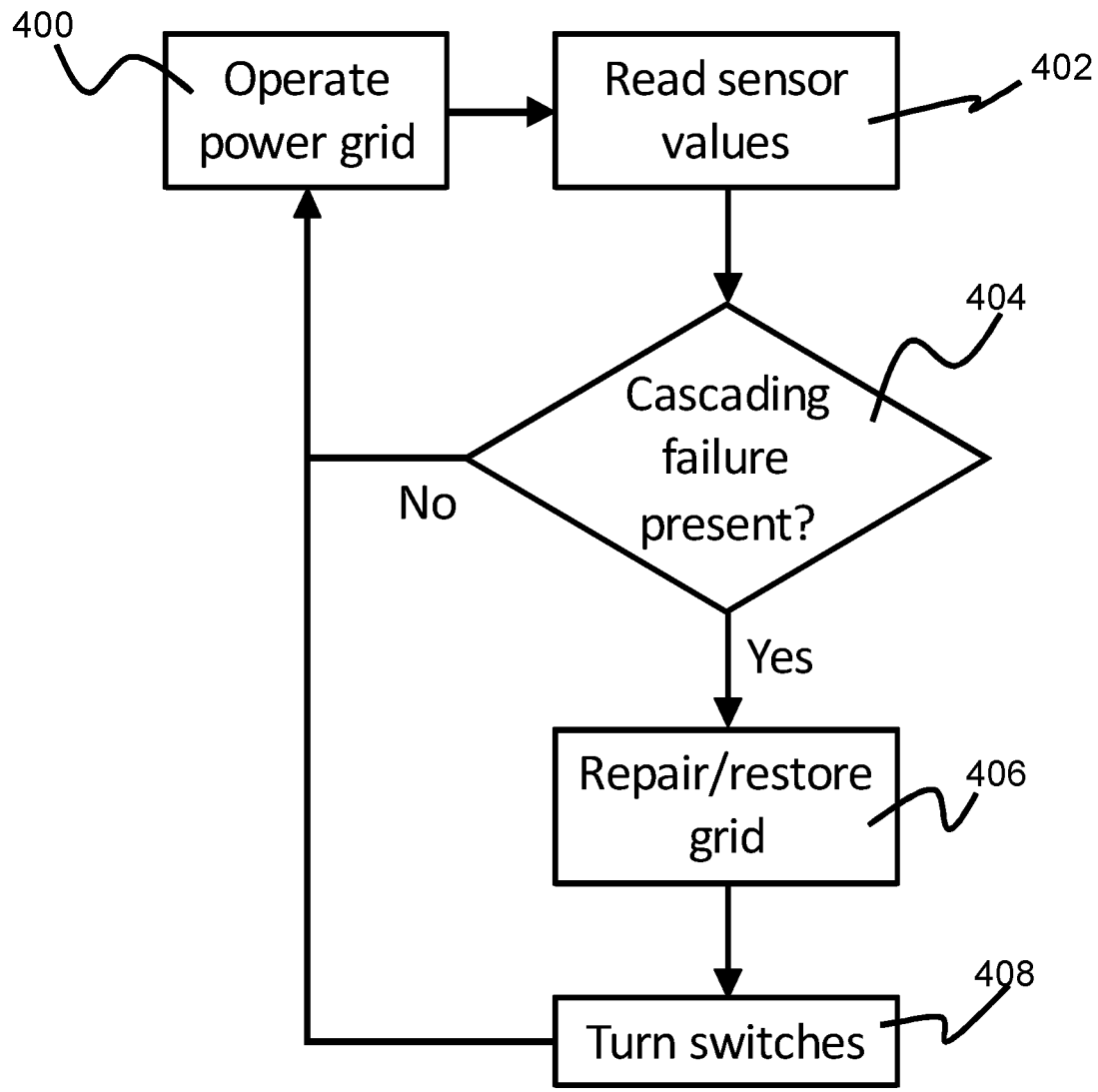
FIG. 4 is an illustration of a process flow of a system for reducing large cascading network failures according to some embodiments of the present disclosure.

FIG. 4 depicts the process flow of the system according to embodiments of the present disclosure. Through operation of the power grid (element 400), sensor values are obtained (element 402). Based on the sensor values (element 402), the system determines whether a cascade failure is present (element 404). If a cascade failure is detected, then the power grid is repaired/restored (element 406), and switches are triggered (element 408).

The switches change the network routes and thus the power flow in the network. It turns out that the frequent changes undermine the accumulation of a large cluster of power lines that are vulnerable to a cascading failure. Instead, small failures (i.e., non-cascading failures) become more frequent, which are easier to compensate for with backup systems.

Figure 5:
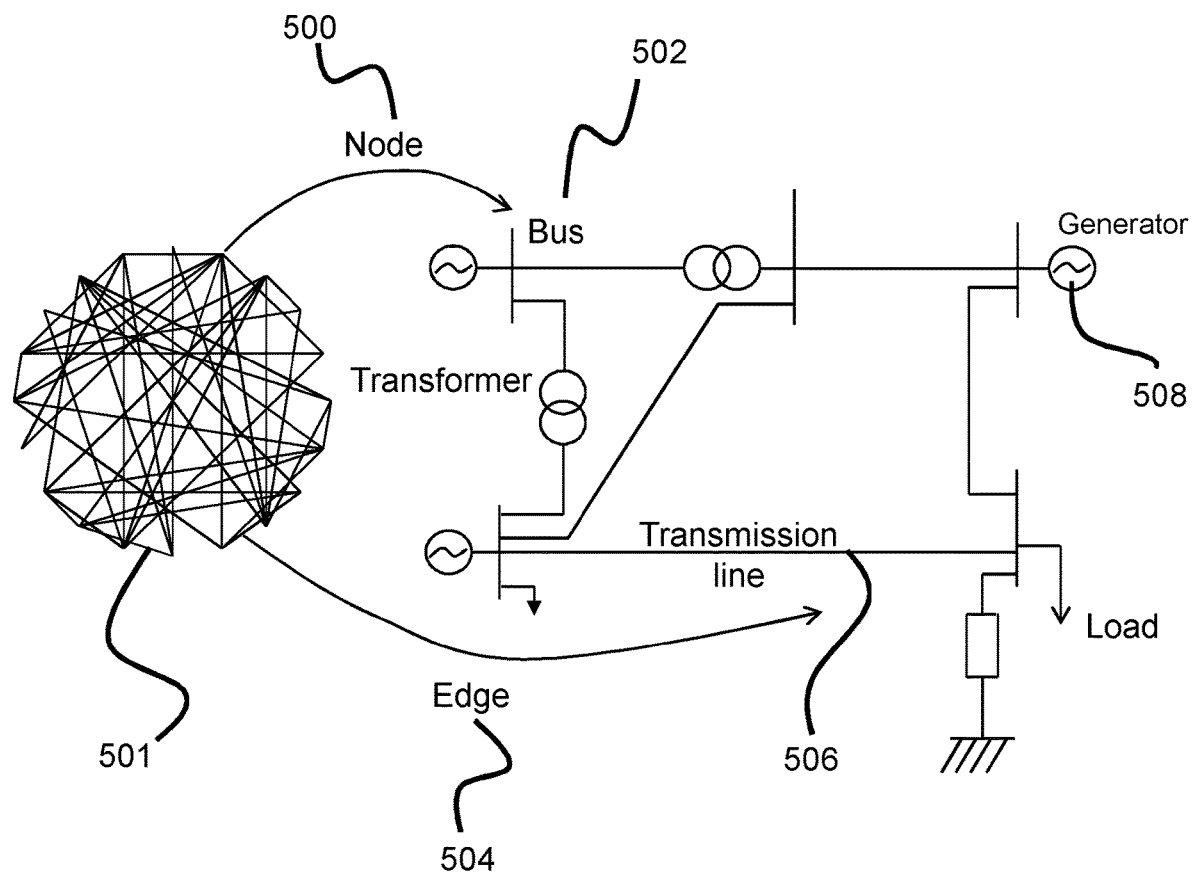
FIG. 5 is an illustration of correspondence between network structure and a power grid model according to some embodiments of the present disclosure.

The proper function of the system according to an embodiment of the present disclosure was tested in a simulation of a transmission network. The transmission network forms a graph that consists of buses (nodes) connected via transmission (power) lines (edges). FIG. 5 illustrates correspondence between a network structure 501 and a power grid model. Nodes 500 correspond to buses 502 and edges 504 to transmission lines 506. Each bus 502 can be connected to a generator 508 and/or a load. The power/transmission lines 506 have complex-valued impedance and admittance parameters. For a given setting of buses 502 and transmission lines 506, the power flow was solved for such that Kirchhoff's law was obeyed. Such solution provides the steady-state voltages and currents given the present load and constraints on power generation. To solve the power-flow equation, the solver MatPower (see Literature Reference No. 5) was used. In this package, three types of buses can be specified, and the type determines the constraint on the power-flow equation. One of the buses was defined as a reference generator, which has a given voltage and phase but variable power. Thus, this generator can compensate for the a priori unknown loss in the power lines.

In experimental studies, all the buses were connected to loads, which were drawn from a random distribution. In one setting, the loads were uniformly distributed within a given interval. A fixed number of the buses were connected to generators. One bus was the reference generator; all other generators equally shared the sum of all loads. The power lines had the same base voltage (345 kV), (i.e., there were no transformers). For each line, a random impedance value was chosen, and the admittance was set to zero.

Figure 6:
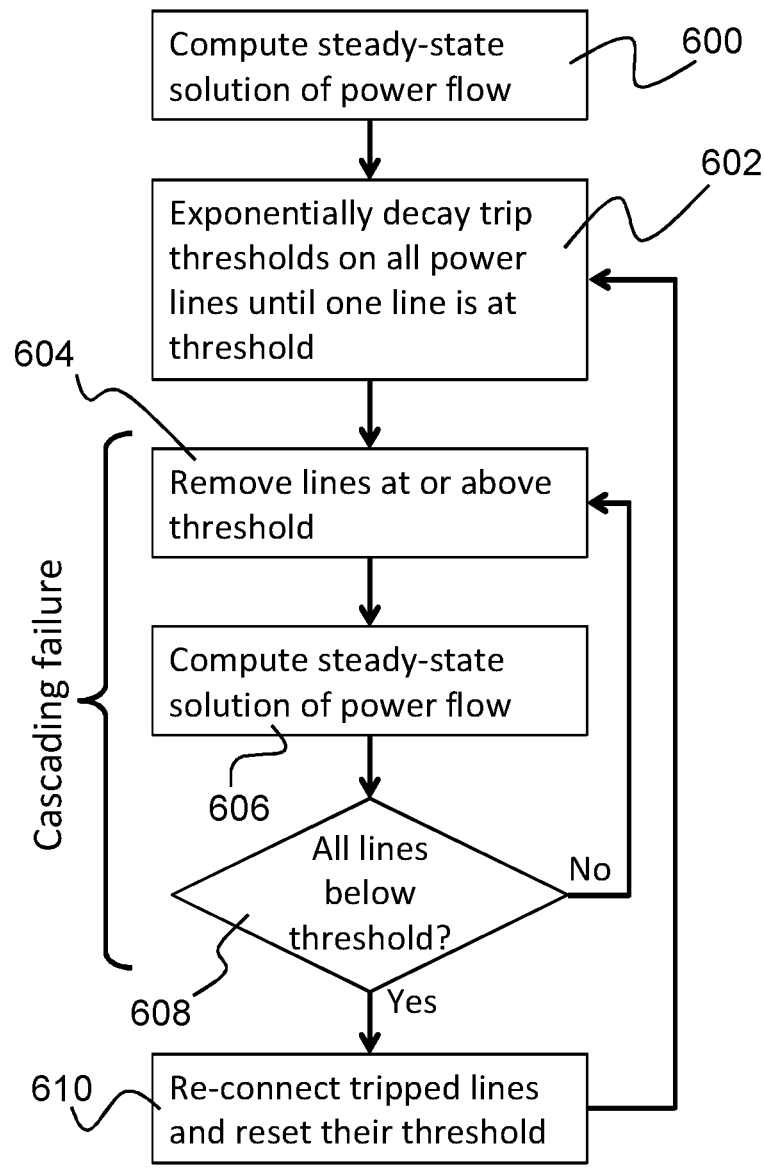
FIG. 6 is an illustration of a process flow of simulation of cascading failures in the transmission network according to some embodiments of the present disclosure.

FIG. 6 illustrates the process flow of the simulation of cascading failures in a transmission network according to embodiments of the present disclosure. To simulate a cascading failure, in a first operation 600, the steady-state solution of power flow is determined. In a second operation 602, trip thresholds on all power lines are exponentially decayed until one line is at threshold. In a third operation 604, transmission/power lines at or above threshold are removed. Following that, the steady-state solution of power flow through the transmission network is again determined in a fourth operation 606. In a fifth operation 608, the system then determines if all power lines are below threshold. If so, tripped lines are reconnected, and their thresholds are reset in a sixth operation 310). If all lines are not below threshold, then the process flow returns to the third operation 604 where additional transmission/power lines at or above threshold are removed. In other words, the power-flow equation is solved and the power loss ($R\,I^2$) is computed for each transmission/power line. Then, iterative checks are performed, and if a loss is above threshold, the corresponding line is removed, and the power flow is re-computed.

It is assumed that the redistribution of voltages after a failure is much faster than the process of consecutively tripping lines. In practice, voltage ripples travel at more than 1000 miles per second through the grid (see Literature Reference No. 6). In the model according to embodiments of the present disclosure, the power flow is recomputed every time after all lines tripped that are above threshold. A transmission network breaks into islands if at least two parts of the network are not path-connected through active transmission lines. In this case, the power flow is solved separately for each island, as long as the island contains at least one generator (otherwise the currents would drop to zero). A cascade ends when all lines are below threshold.

In order to assess the statistics of the cascading-failure sizes, a process of component decay (element 602) and repair was set up that on a long time scale is invariant in time. Initially, all lines were assigned a random trip threshold for the loss $R I^2$. To simulate component decay (element 602), the trip threshold decreased exponentially at the same rate on all lines. As soon as one line was at threshold, a cascade was triggered. After a cascade, the thresholds on all lines that were involved in the cascade were reset to their original value (element 610), simulating a repair or upgrade of components. In the real world, this repair may occur over several days.

In experimental studies, a random geometric graph with 4,096 nodes/buses and an average degree of 12 (i.e., average number of transmission lines connected to a bus) was used as a network. To set up the switches, 100 linearly connected arrays of four nodes were selected at random. This selection happened once before the simulation run, which corresponds to having dedicated local physical sites to carry out the switching. FIG. 7A illustrates switching between two alternative local connections, A and B, in each 4-node array, where A is the original setting and B was obtained by changing the connection between nodes 1 and 2 to nodes 1 and 4. After each cascading failure, all 100 arrays were switched between A and B. The switching changed the average path length only minimally (e.g., less than 2%). Thus, the change in path lengths would not be the cause of the observed results.

Figure 7B:
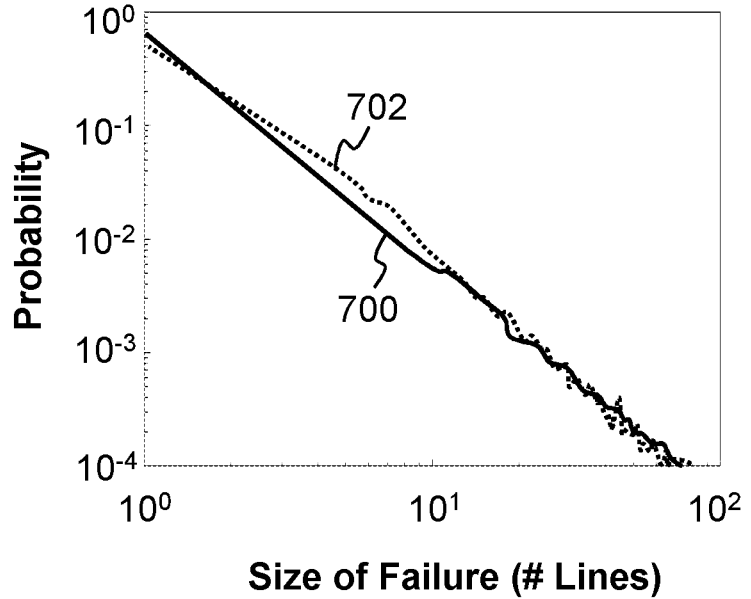
FIG. 7B is a plot illustrating network failure probabilities according to some embodiments of the present disclosure.

Switching between A and B at 100 randomly predetermined locations increased the slope of the failure distribution for sufficiently large failures (see FIG. 7B). In one embodiment, a random geographic graph with 4,096 nodes was used, where the solid line 700 represents no switch and the dashed line 702 represents the switch of the 100 lines. This switching strategy indeed changed the failure size distribution. For failures larger than 7 lines, the slope changed from −2.0 to −2.3. A steeper slope is preferable, since it implies that larger failures occur at a lower probability.

The system described herein can decrease the frequency of large cascading failures by orders of magnitude. Thus, the system is beneficial when the cost of a large event is high. For example, for the power-grid, the cost of an outage depends non-linearly on its size. Smaller outages can be compensated by backup systems, while large events lead to lost revenue, spoiled goods, and other cost in addition to repairs. For instance, the 2003 Northeast Blackout was estimated to reduce U.S. earning by $6.4 billion (see Literature Reference No. 1).

Additionally, electric cars will depend on a reliable power-grid. Further, the system according to embodiments of the present disclosure is applicable in smart grid technologies related to electrical vehicles (e.g. smart charging) and large networks of charging stations for electrical vehicles. A smart grid is an electricity supply network that uses digital communications technology to detect and react to local changes in usage.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A system for reducing large cascading failures in a transmission network, the system comprising:
one or more processors and a non-transitory computer-readable medium having executable instructions encoded thereon such that when executed, the one or more processors perform operations of:
determining if a cascading failure is present in a transmission network having transmission lines; and
following determination of the cascading failure, switching between transmission lines in the transmission network through activation of at least one switch of a plurality of switches distributed in the transmission network, whereby connectivity in the transmission network is altered,
wherein altering connectivity in the transmission network prevents the accumulation of a cluster of transmission lines that are vulnerable to a cascading failure,
wherein a frequency of non-cascading failures in the transmission network is increased when connectivity in the transmission network is altered.

2. The system as set forth in claim 1, wherein a plurality of sensors distributed throughout the transmission network monitor occurrence of cascading failures by identifying tripped or broken transmission lines.

3. The system as set forth in claim 1, wherein the one or more processors further perform an operation of activating a subset of the plurality of switches following determination of the cascading failure.

4. The system as set forth in claim 1, wherein the one or more processors further perform an operation of gradually activating each of the plurality of switches individually following determination of the cascading failure.

5. The system as set forth in claim 1, wherein the one or more processors further perform an operation of gradually activating subsets of the plurality of switches, each subset at a time, following determination of the cascading failure.

6. The system as set forth in claim 1, wherein the transmission network is a smart grid used by electrical vehicles.

7. The system as set forth in claim 1, wherein the transmission network comprises at least one set of a plurality of buses, wherein the plurality of buses in the set are connected in series by transmission lines and consecutively numbered, such that a first bus is not directly connected with a last bus, wherein for each set, a switch is installed at one of the first or the last bus in the set and a transmission line is installed connecting the switch and the other of the first or the last bus, such that a switch setting can alternate between two connectivity configurations.

8. A computer implemented method for reducing large cascading failures in a transmission network, the method comprising an act of:

causing one or more processors to execute instructions encoded on a non-transitory computer-readable medium, such that upon execution, the one or more processors perform operations of:

determining if a cascading failure is present in a transmission network having transmission lines; and following determination of the cascading failure, switching between transmission lines in the transmission network through activation of at least one switch of a plurality of switches distributed in the transmission network whereby connectivity in the transmission network is altered, wherein altering connectivity in the transmission network prevents the accumulation of a cluster of transmission lines that are vulnerable to a cascading failure, wherein a frequency of non-cascading failures in the transmission network is increased when connectivity in the transmisison network is altered.

9. The method as set forth in claim 8, wherein a plurality of sensors distributed throughout the transmission network monitor occurrence of cascading failures by identifying tripped or broken transmission lines.

10. The method as set forth in claim 8, wherein the one or more processors further perform an operation of activating a subset of the plurality of switches following determination of the cascading failure.

11. The method as set forth in claim 8, wherein the one or more processors further perform an operation of gradually activating each of the plurality of switches individually following determination of the cascading failure.

12. The method as set forth in claim 8, wherein the one or more processors further perform an operation of gradually activating subsets of the plurality of switches, each subset at a time, following determination of the cascading failure.

13. The method as set forth in claim 8, wherein the transmission network is a smart grid used by electrical vehicles.

14. A computer program product for reducing large cascading failures in a transmission network, the computer program product comprising:

computer-readable instructions stored on a non-transitory computer-readable medium that are executable by a computer having one or more processors for causing the processor to perform operations of:

determining if a cascading failure is present in a transmission network having transmission lines; and following determination of the cascading failure, switching between transmission lines in the transmission network through activation of at least one switch of a plurality of switches distributed in the transmission network whereby connectivity in the transmission network is altered, wherein altering connectivity in the transmission network prevents the accumulation of a cluster of transmission lines that are vulnerable to a cascading failure, wherein a frequency of non-cascading failures in the transmisison network is increased when connectivity in the transmission network is altered.

15. The computer program product as set forth in claim 14, wherein a plurality of sensors distributed throughout the transmission network monitor occurrence of cascading failures by identifying tripped or broken transmission lines.

16. The computer program product as set forth in claim 14, further comprising instructions for causing the one or more processors to further perform an operation of activating a subset of the plurality of switches following determination of the cascading failure.

17. The computer program product as set forth in claim 14, further comprising instructions for causing the one or more processors to further perform an operation of gradually activating each of the plurality of switches individually following determination of the cascading failure.

18. The computer program product as set forth in claim 14, further comprising instructions for causing the one or more processors to further perform an operation of gradually activating subsets of the plurality of switches, each subset at a time, following determination of the cascading failure.

19. The computer program product as set forth in claim 14, wherein the transmission network is a smart grid used by electrical vehicles.

* * * * *